(12) United States Patent
Dijon et al.

(10) Patent No.: US 8,137,763 B2
(45) Date of Patent: Mar. 20, 2012

(54) METHOD OF PRODUCING A LAYER OF MATERIAL ON A SUPPORT

(75) Inventors: Jean Dijon, Champagnier (FR); Francoise Geffraye, La Buisse (FR)

(73) Assignee: Commissariat a l'Energie Atomique, Paris (FR)

( * ) Notice: Subject to any disclaimer, the term of this patent is extended or adjusted under 35 U.S.C. 154(b) by 839 days.

(21) Appl. No.: 10/588,703

(22) PCT Filed: Feb. 7, 2005

(86) PCT No.: PCT/FR2005/050073
§ 371 (c)(1),
(2), (4) Date: Aug. 8, 2006

(87) PCT Pub. No.: WO2005/075077
PCT Pub. Date: Aug. 18, 2005

(65) Prior Publication Data
US 2007/0237704 A1 Oct. 11, 2007

(30) Foreign Application Priority Data

Feb. 9, 2004 (FR) ..................................... 04 50227

(51) Int. Cl.
*B05D 3/06* (2006.01)
*B05D 3/02* (2006.01)
*C23C 16/06* (2006.01)
*C23C 16/26* (2006.01)
*C23C 16/40* (2006.01)
*C23C 16/56* (2006.01)

(52) U.S. Cl. ..... 427/553; 427/539; 427/250; 427/249.1; 427/271; 427/274; 427/376.7; 427/376.6; 427/404; 427/419.2

(58) Field of Classification Search ........................ None
See application file for complete search history.

(56) References Cited

U.S. PATENT DOCUMENTS

| 5,084,144 | A | 1/1992 | Reddy et al. | |
|---|---|---|---|---|
| 6,538,367 | B1 * | 3/2003 | Choi et al. | 313/309 |
| 7,491,634 | B2 * | 2/2009 | Huotari et al. | 438/592 |
| 7,608,147 | B2 * | 10/2009 | Samuelson et al. | 117/89 |
| 7,635,503 | B2 * | 12/2009 | Dominguez et al. | 427/249.1 |
| 7,645,482 | B2 * | 1/2010 | Burke et al. | 427/248.1 |
| 7,718,224 | B2 * | 5/2010 | Burke et al. | 427/248.1 |
| 7,820,064 | B2 * | 10/2010 | Jin | 216/41 |
| 7,892,316 | B2 * | 2/2011 | Kaneko et al. | 75/348 |

(Continued)

FOREIGN PATENT DOCUMENTS

EP 1061041 A1 * 12/2000

(Continued)

OTHER PUBLICATIONS

Webster's Ninth New Collegiate Dictionary, Merriam-Webster Inc., USA, 1990 (no month), excerpt p. 384-385.*
Teo et al., "Field emission from dense, sparse, and patterned arrays of carbon nanofibers", Applied Physics Letters, vol. 80, No. 11, Mar. 18, 2002, three pp. 2011-2013.*

(Continued)

*Primary Examiner* — Marianne L Padgett
(74) *Attorney, Agent, or Firm* — Oblon, Spivak, McClelland, Maier & Neustadt, L.L.P.

(57) ABSTRACT

Processes for preparing catalyst structures, include forming a layer of a catalytic material on a substrate, and separating the layer of the catalytic material into droplet-shaped bodies of the catalytic material adhered to the substrate.

17 Claims, 2 Drawing Sheets

U.S. PATENT DOCUMENTS

| | | | |
|---|---|---|---|
| 7,923,382 B2* | 4/2011 | Huotari et al. | 438/785 |
| 7,951,422 B2* | 5/2011 | Pan et al. | 427/248.1 |
| 2002/0014667 A1* | 2/2002 | Shin et al. | 257/368 |
| 2002/0024279 A1* | 2/2002 | Simpson et al. | 313/309 |
| 2002/0117951 A1* | 8/2002 | Merkulov et al. | 313/309 |
| 2002/0163287 A1* | 11/2002 | Cheng et al. | 313/309 |
| 2002/0171347 A1* | 11/2002 | Hirasawa et al. | 313/311 |
| 2003/0098640 A1* | 5/2003 | Kishi et al. | 313/309 |
| 2003/0234417 A1 | 12/2003 | Raaijmakers et al. | |
| 2005/0000318 A1* | 1/2005 | Keller et al. | 75/255 |
| 2005/0011431 A1* | 1/2005 | Samuelson et al. | 117/40 |
| 2006/0006377 A1* | 1/2006 | Golovchenko et al. | 257/39 |
| 2007/0196575 A1* | 8/2007 | Dominguez et al. | 427/249.1 |
| 2008/0292835 A1* | 11/2008 | Pan et al. | 428/98 |
| 2009/0246367 A1* | 10/2009 | Huotari et al. | 427/215 |
| 2009/0283735 A1* | 11/2009 | Li et al. | 257/1 |
| 2010/0035412 A1* | 2/2010 | Samuelson et al. | 438/478 |
| 2010/0285656 A1* | 11/2010 | Esconjauregui et al. | 438/478 |
| 2010/0291297 A1* | 11/2010 | Nagasaka et al. | 427/249.1 |
| 2010/0313951 A1* | 12/2010 | Nalamasu et al. | 136/256 |
| 2011/0111300 A1* | 5/2011 | DelHagen et al. | 429/223 |
| 2011/0171494 A1* | 7/2011 | Lin et al. | 428/827 |

FOREIGN PATENT DOCUMENTS

| | | | |
|---|---|---|---|
| WO | 96 22841 | | 8/1996 |
| WO | WO 00/30141 | * | 5/2000 |
| WO | 03 027011 | | 4/2003 |
| WO | WO 03/048040 A1 | * | 6/2003 |

OTHER PUBLICATIONS

Yudasaka, Masako et al.,"Specific Conditions for Ni Catalyzed Carbon Nanotube Growth by Chemical Vapor Deposition", *Applied Physics Letters*, vol. 67, No. 17, pp. 2477-2479, Oct. 1995.

Cottel, C. M. et al.,"Microstructual Development of Thin Films Grown by Pulsed Laser Deposition", *Materials Science and Engineering* B, vol. 32, No. 3, pp. 221-230, 1995.

Siegal, M. P. et al.,"Precise Control of Multiwall Carbon Nanotube Diameters Using Thermal Chemical Vapor Deposition", *Applied Physics Letters*, vol. 80, No. 12, pp. 2171-2173, Mar. 2002.

Gao, J. S. et al.,"Plasma Breaking of Thin Films into Nano-Sized Catalysts for Carbon Nanotube Synthesis", *Materials Science and Engineering A*, vol. 352, pp. 308-313, 2003.

Choi, Jong Hyung et al.,"Density Control of Carbon Nanotubes Using $NH_3$ Plasma Treatment of Ni Catalyst Layer", *Thin Solid Films*, vol. 435, pp. 318-323, 2003.

Office Action issued May 10, 2011, in Japan Patent Application No. 2006-551895, filed Apr. 28, 2011, (with English-language Translation).

C.M. Cotell, et al., "Microstructural Development of Thin Films Grown by Pulsed Laser Deposition," *Materials Science and Engineering* B32 (1995) 221-230.

Masako Yudasaka et al., "Specific Conditions for Ni Catalyzed Carbon Nanotube Growth by Chemical Vapor Deposition," *Appl. Phys. Lett.* 67 (17) Oct. 23, 1995.

* cited by examiner

METHOD OF PRODUCING A LAYER OF MATERIAL ON A SUPPORT

TECHNICAL FIELD AND PRIOR ART

The invention relates to manufacturing of a fragmented thin layer of material on a support.

It is particularly applicable to obtaining a catalyst in order to make carbon nanotubes or nanofibres.

The catalyst is an important element used for the growth of carbon nanotubes both for pure thermal CVD (chemical vapour phase deposition) growth processes and for plasma assisted deposition techniques.

Obviously, efficiency is one of the qualities required for a catalyst; technical integration problems mean that attempts are made to obtain catalysts that enable growth reactions at the lowest possible temperatures.

Another requirement is a certain division state of the catalyst; in practice, an attempt is made to produce medium to small diameter catalytic particles. The diameter of nanotubes obtained is a direct image of the diameter of catalytic particles.

Stability with regard to the temperature is another important parameter; this relates to the capacity of the catalyst to maintain its division state in which there is no coalescence between nanoparticles during the growth process.

An attempt is also made to find a catalyst that can be integrated into microelectronic devices. Thin nickel, cobalt or iron layers are used to achieve this.

This type of catalyst is described for example in the publication by Yudasaka M, Applied Physic Letter 1995, 67, p. 2477. It is well known that the size of particles obtained depends on the thickness of the deposited layer.

On the other hand, the problem of stability is not solved, for example as described in the publication by Siegal M P et al., Applied Physics Letters 2002, 80(12), p. 2171 in which a strong coalescence of Ni droplets is observed.

Furthermore, the catalyst can only be divided into drops or split up efficiently at temperatures of the order of 600° C., which means that processes using this catalyst have to operate at temperatures close to 600° C.

The use of plasma was proposed particularly on Ni or Fe layers to etch the catalyst. The plasma is either a nitrogen plasma at a relatively high temperature between 600° C. and 900° C. (see the publication by Gao .J S, Materials Science and Engineering 2003, A352, p. 308-313) or an ammonia plasma at 390° C. (for example see the publication by Choi J H, Thin Solid Films 2003, 435, p. 318-323). In the latter case, the objective is to etch the catalyst to control the particle density. The particles obtained are relatively thick (between 60 and 100 nm diameter) except for deposited layer thicknesses of the order of one nm.

Therefore, it can be seen that the four parameters mentioned above are not satisfied and that the only parameter that can vary the diameter of particles obtained is the thickness of the deposited layer. There is a problem in obtaining a catalyst using the processes described, and more generally a finely divided material; in particular, it requires very thin layers that are difficult to control.

PRESENTATION OF THE INVENTION

The purpose of this invention is a process for manufacturing a divided material to obtain a large division state. This division state can be controlled using a parameter other than the thickness of the deposited layer of this material.

The invention relates firstly to a process including a step to deposit a thin layer of a first material in discontinuous form on a face of a support and then a step to form drops by heat treatment or by a low temperature hydrogen plasma treatment.

Deposition in discontinuous form means a sequence of deposits of the same material separated by waiting phases under a vacuum or in a controlled atmosphere, in other words the deposition is discontinuous in time.

The thin layer is normally in the form of a film and its thickness may be between one and a few nanometres, for example between 1 nm and 10 nm. It is also preferable for the surface tension of the material on the surface of the support to be lower than the surface tension of the material to be divided. Advantageously, the droplets formed are uniformly rounded and/or uniformly distributed. It is also preferable if these materials do not interact together or interact only slightly (few diffusion phenomena, few or no chemical reactions).

If the support interacts excessively with the material to be divided during the deposition and then the plasma treatment steps, a diffusion barrier layer can be made in advance, for example a TiN layer if the first material is nickel. This barrier layer will also determine division and stability properties of the divided material.

Advantageously, the first material will be a catalytic metal such as nickel, iron or cobalt. In this case, drops are created by plasma treatment of hydrogen at low temperature (typically 300° C.), the result is then an active catalyst starting from 300° C. that can be used for low temperature growth processes.

The deposition step of a layer of catalytic metal can be done in the presence of a partial pressure of oxygen, which gives even better control over the diameter of catalyst grains.

The invention also relates to a process for the growth of carbon nanotubes or nanofibres, including:
  production of a catalyst layer like that described above,
  growth of nanotubes or nanofibres on the catalyst layer thus obtained.

Nanotubes or nanofibres may be grown by chemical vapour deposition.

The invention also relates to a process for manufacturing a surface of a support with a controlled roughness, including the production of a thin layer, for example a continuous film, of a material on this support, using one of the processes described above.

It also relates to a process for producing a metal/oxide mix on the surface of a support, including:
  production of a fragmented thin layer of a metallic material on this support, as described above,
  formation of an oxide layer on the layer of material thus formed,
  a polishing step.

DETAILED DESCRIPTION OF PARTICULAR EMBODIMENTS

Figure 1:
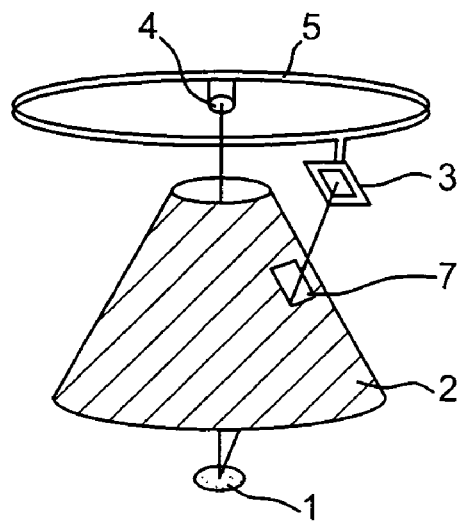
FIG. 1 shows a device used to manufacture a process according to the invention.

FIG. 1 shows a device that enables a very precise control of the thickness of the deposited layer and particularly the discontinuous deposition of this layer in time, which is also continuous over a surface; the device is an electron gun evaporation unit with a planetary system.

A filler 1, for example made of nickel, is evaporated at ambient temperature through a cache 2 towards a sample-holder 3 itself fixed on a rotating planetary system 5. A detector 4 checks the thickness of nickel deposited on the sample holder 3.

The measurement, made using measurement means 4, is made on a thickness greater than the thickness deposited on the substrate 3, depending on the ratio between the size of the opening 7 made in the cache 2 and the perimeter of this cache.

The sample holder 3 is only affected by the deposit when it is on the centre line of the opening 7 made in the cache, while the detector 4 is affected by a continuous deposit during all rotations of the planetary system.

This device can be used for controlled discontinuous evaporation, for example with a deposition time of 1/10 and a non-deposition time of 9/10 if the size of the opening corresponds to one tenth of the perimeter of the cache.

Figure 2:
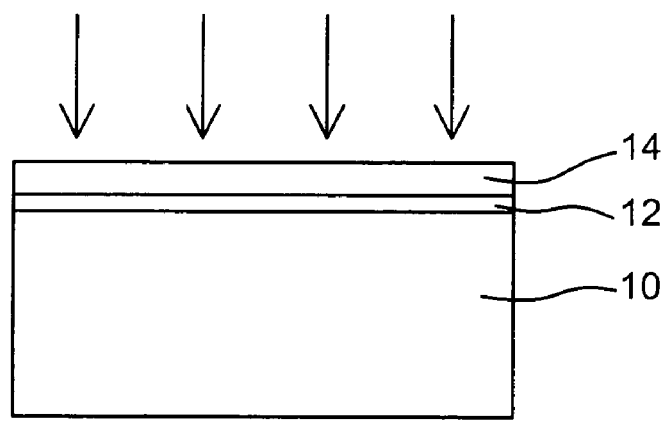
FIG. 2 shows a compound according to the invention.

The structure obtained is shown in FIG. 2 and comprises a substrate 10, a layer or film 14 of deposited material with a thickness typically varying from 1 to 10 mm obtained by discontinuous deposition and possibly a diffusion barrier layer 12.

A low temperature heat treatment or hydrogen plasma treatment changes the deposited material into drops, in other words structures the film so as to form a discontinuous set of drops of material which is more or less homogeneous, and/or with more or less uniform shape, size and distribution. In the case of a catalytic material, this treatment can also activate said catalyst of the layer 14. Low temperature typically means from ambient temperature (about 20° C.) to 500° C., for example from 200° C. to 500° C., and preferably about 300° C.

We will now give examples of catalysts produced according to the invention.

EXAMPLE 1

In this example, the material is treated by annealing.

The layer 12 is a 60 nm thick layer of TiN deposited by reactive cathodic sputtering at ambient temperature.

The sputtering gas is a mix of argon and nitrogen (80%/20%).

The layer 14 of Ni is made discontinuously using an electron gun at ambient temperature, using the device described above. The material is put into drops by a standard heat treatment at 600° C. under partial pressure of hydrogen.

More generally, this heat treatment can be done at between 500° C. and 600° C., which is the conventionally used range.

Under these conditions, the result is a distribution of Ni particles in which the average and standard deviation of the diameter are given in table I below as a function of the deposited Ni thickness.

The results obtained on standard layers of Ni (in other words deposited continuously) are given in table II below.

TABLE I

Distribution parameters for particles obtained according to the invention

| Ni thickness | 2 nm | 3 nm | 5 nm | 10 nm |
|---|---|---|---|---|
| Average | 16 nm | 17 nm | 37.6 | 86.6 |
| Standard deviation | 0.7 | 0.7 | 0.5 | 0.6 |

TABLE II

Distribution parameters for particles obtained with standard Ni layers

| Ni thickness | 3 nm | 10 nm |
|---|---|---|
| Average | 54 nm | 139 nm |
| Standard deviation | 0.45 | 0.68 |

Comparing tables I and II, it can be seen that the invention results in an improvement to the diameter of particles obtained by a factor of between 1.5 and 3.

Figure 3A:
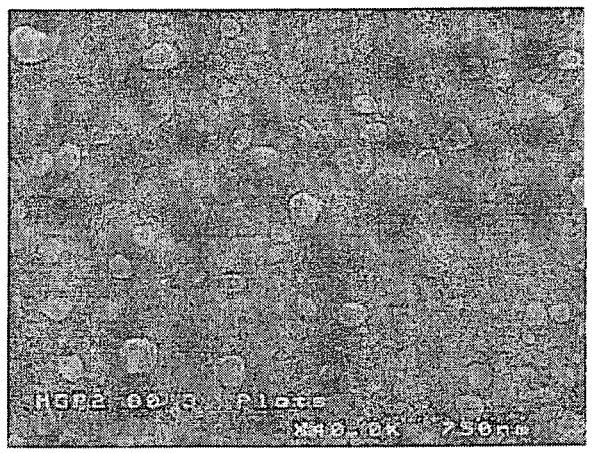
FIGS. 3A and 3B show a scanning electron microscopy (SEM) image of a 3 nm thick nickel film, obtained using a process according to prior art and using a process according to the invention.
Figure 3B:
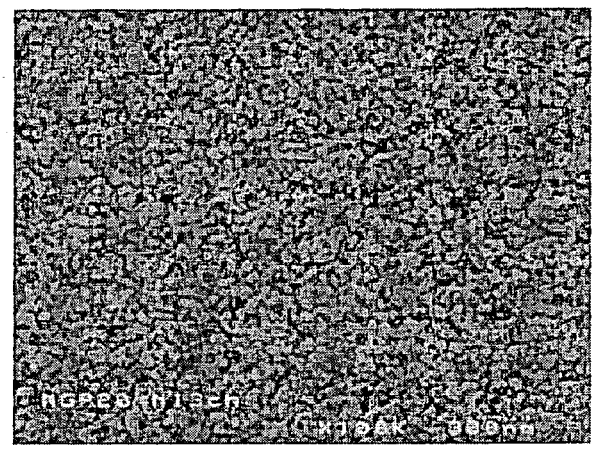

FIGS. 3A and 3B each show an SEM image of a 3 nm nickel film deposited on an identical sublayer of TiN put into drops at 600° C.

FIG. 3A (×40000) relates to a standard process, FIG. 3B (×100000) relates to a process according to the invention. Once again, it can be seen that a gain of the order of 3 is obtained using a process according to the invention.

EXAMPLE 2

With Plasma

In this example, the material is treated by plasma.

Depositions are the same as in example 1 with treatment of the deposit at 300° C. using a radio frequency plasma (RF) of hydrogen.

The RF power is 300 W, the treatment time is 10 minutes, and the hydrogen pressure is 150 mTorr.

Table III shows the result of treatment by hydrogen plasma at 300° C. on a film deposited using the process according to the invention (in other words discontinuously) and using a standard process (in other words continuously).

TABLE III

| Ni thickness | 3 nm | 3 nm | 10 nm |
|---|---|---|---|
| Average | 18 nm | No putting in drops | No putting in drops |
| Standard deviation | 0.5 | | |
| Ni deposition process | According to the invention | Standard | Standard |

It can be seen that the standard layers are not put into drops by the low temperature plasma process, unlike the layers made according to the invention.

EXAMPLE 3

Partial Pressure of $O_2$+Plasma

In this example, the material is treated under a partial pressure of $O_2$ and by plasma.

The TiN layer 12 is a 60 nm thick layer deposited by reactive cathodic sputtering.

The sputtering gas is an argon/nitrogen mix (80%/20%).

The layer 14 of Ni is made by an electron gun at ambient temperature using the device described above. An oxygen partial pressure equal to $3\times10^{-5}$ mbars is added during the deposition of Ni.

The layer is divided using the $H_2$ plasma process at 300° C., as described in the previous example.

Table IV contains results related to the size of catalyst particles when an oxygen partial pressure is introduced during deposition.

TABLE IV

| Ni thickness | 3 nm | 3 nm | 10 nm | 10 nm |
|---|---|---|---|---|
| O₂ partial pressure | 0 | $3 \times 10^{-5}$ mbars | 0 | $3 \times 10^{-5}$ mbars |
| Average | 18 nm | 13.5 nm | No putting in drops | 24 nm |
| Standard deviation | 0.5 | 0.5 | | 0.5 |

Table IV shows the role of oxygen during the deposition of Ni. The diameter of the catalyst grains can be controlled by adjusting the oxygen partial pressure, typically between $10^{-6}$ and $10^{-4}$ mbars.

Therefore catalysts made according to the invention have very good stability at high temperatures up to 650° C. After two hours at 630° C., the average value of the distribution for a 3 nm layer of Ni treated by plasma has increased from 18 nm to 23 nm.

Growth of nanotubes can then be continued quite satisfactorily using a thermal CVD (chemical vapour deposition) process at 540° C. and with $C_2H_2$ as the reactive gas.

Figure 4:
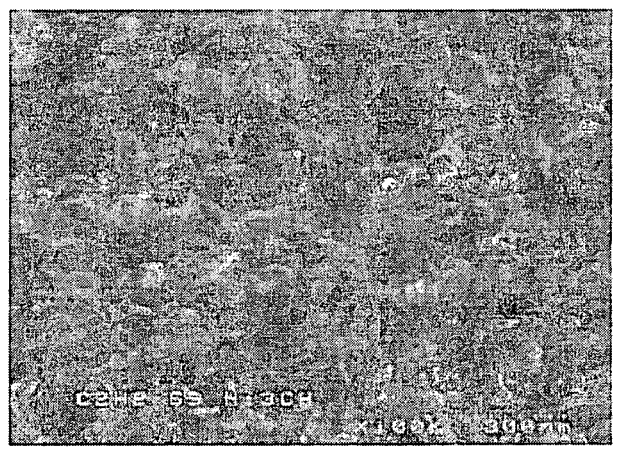
FIG. 4 shows nanotubes obtained by growth on a catalyst using a process according to the invention.

FIG. 4 shows the growth of nanotubes obtained on a catalyst according to the invention at 540° C., with a CVD process at 540° C. (approximately 20 nm tubes). This is an SEM image with ×100000 magnification.

Therefore, it can be seen that the catalyst made according to the invention satisfies the following criteria:

strong reactivity at temperatures between 500° C. and 600° C.;

very strong division of the catalyst, the average diameter of particles obtained being possibly between 10 nm and 90 nm depending on the thickness of the catalyst;

stability under the temperature conditions used, in other words up to at least 650° C.;

easiness to integrate into the device technology because the depositions are made at ambient temperature and are therefore compatible with conventional resin lift off steps.

Therefore, it is easy to localise the catalyst deposit using these steps.

More particularly, the invention relates to a process capable of obtaining particles of a given material on one face of a support, the particles having a controlled density and size. This material can be metallic (iron, nickel, cobalt, or semiconductors compounds, for example silicon). To achieve this, it is deposited discontinuously in a thin film (typically a few nanometres) on the support, and is then put into drops by a heat treatment or plasma treatment.

The support face is chosen to interact only slightly with the material to be divided (little diffusion, little or no chemical reaction). This is the case for nickel on TiN, but also more generally of metals on an oxide or silicon on an oxide. A diffusion barrier may be inserted if necessary (for example made of TiN or oxide, etc.).

This process may have applications other than catalysis for growth of nanotubes.

The particles thus distributed can be used to control the surface roughness of said support, and its structure on the scale of the drop size, namely about 20 nm. This structured surface may subsequently be covered by an oxide (for example silica) and then polished, to obtain a calibrated mix of particles, for example metallic particles, in an oxide (with CERMET type applications).

The invention claimed is:

1. A process for preparing a catalyst structure, comprising:
    forming a continuous layer of a catalytic material on a surface of a substrate; and
    forming the catalyst structure by separating the continuous layer of the catalytic material into droplet-shaped bodies of the catalytic material adhered to the substrate;
    wherein:
    the continuous layer of the catalytic material is in the form of a film;
    the surface of the substrate has a surface tension lower than a surface tension of the continuous layer of the catalytic material when the continuous layer of the catalytic material is formed on the surface of the substrate;
    the catalytic material is a material suitable for catalyzing formation of carbon nanotubes or carbon nanofibers;
    the continuous layer of the catalytic material is formed by making a sequence of deposits of the catalytic material on to the surface of the substrate to form continuous sublayers of the catalytic material separated by waiting phases under a vacuum or in a controlled atmosphere; and
    the deposits of the catalytic material are made by exposing the substrate to a source of evaporated catalytic material and the waiting phases are carried out by shielding the substrate from the source of evaporated catalytic material.

2. The process according to claim 1, wherein the continuous layer of the catalytic material is separated into droplet-shaped bodies by applying a heat treatment.

3. The process according to claim 1, wherein the continuous layer of the catalytic material is separated into droplet-shaped bodies by applying a hydrogen plasma treatment at low temperature of about 20° C.-500° C.

4. The process according to claim 1, wherein the catalytic material is nickel, iron or cobalt.

5. The process according to claim 1, wherein the layer of the catalytic material is formed under partial pressure of oxygen.

6. A process for growing carbon nanotubes or carbon nanofibers, comprising:
    preparing a catalyst structure by the method according to claim 1; and
    growing carbon nanotubes or carbon nanofibers on the catalyst structure.

7. The process according to claim 6, wherein the carbon nanotubes or carbon nanofibers are grown by chemical vapor phase deposition.

8. A process for producing substrate having a surface with controlled roughness, comprising:
    preparing a catalyst structure by the method according to claim 1;
    forming an oxide layer on the catalyst structure to form a resulting structure; and
    polishing the resulting structure.

9. A process for producing a substrate including a surface with a metal/oxide mix, comprising:
    preparing a catalyst structure by the method according to claim 1;
    forming an oxide layer on the catalyst structure to form a resulting structure; and
    polishing step the resulting structure;
    wherein the catalytic material is a metal.

10. A process for preparing a catalyst structure, comprising:
   forming a thermal or diffusion barrier layer on a substrate;
   forming a continuous layer of a catalytic material on a surface of the barrier layer; and
   forming the catalyst structure by separating the continuous layer of the catalytic material into droplet-shaped bodies of the catalytic material adhered to the barrier layer;
   wherein:
   the continuous layer of the catalytic material is in the form of a film;
   the surface of the barrier layer has a surface tension lower than a surface tension of the continuous layer of the catalytic material when the continuous layer of the catalytic material is formed on the surface of the barrier layer;
   the catalytic material is a material suitable for catalyzing formation of carbon nanotubes or carbon nanofibers;
   the continuous layer of the catalytic material is formed by making a sequence of deposits of the catalytic material on to the surface of the barrier layer to form continuous sublayers of the catalytic material separated by waiting phases under a vacuum or in a controlled atmosphere; and
   the deposits of the catalytic material are made by exposing the substrate to a source of evaporated catalytic material and the waiting phases are carried out by shielding the substrate from the source of evaporated catalytic material.

11. The process according to claim 10, wherein the continuous layer of the catalytic material is formed by applying a heat treatment or applying a hydrogen plasma treatment at low temperature of about 20° C.-500° C.

12. The process according to claim 10, wherein the continuous layer of the catalytic material is formed under partial pressure of oxygen.

13. A process for growing carbon nanotubes or carbon nanofibers, comprising:
   preparing a catalyst structure by the method according to claim 10; and
   growing carbon nanotubes or carbon nanofibers on the catalyst structure.

14. The process according to claim 13, wherein the carbon nanotubes or carbon nanofibers are grown by chemical vapor phase deposition.

15. A process for producing a substrate having a surface with a controlled roughness, comprising preparing a catalyst structure by the method according to claim 10;
   forming an oxide layer on the catalyst structure to form a resulting structure; and
   polishing the resulting structure.

16. A process for producing a substrate having a surface including a metal/oxide mix, comprising:
   preparing a catalyst structure by the method according to claim 10;
   forming an oxide layer on the catalyst structure to form a resulting structure; and
   polishing the resulting structure;
   wherein the catalytic material comprises a metal.

17. The process according to claim 10, wherein the barrier layer is a TiN layer or an oxide layer.

* * * * *